(12) United States Patent
Jiang et al.

(10) Patent No.: US 10,775,418 B2
(45) Date of Patent: Sep. 15, 2020

(54) METHOD AND SYSTEM FOR OSCILLOSCOPE TRIGGERING

(71) Applicant: UNIVERSITY OF ELECTRONIC SCIENCE AND TECHNOLOGY OF CHINA, Chengdu, Sichuan (CN)

(72) Inventors: Jun Jiang, Chengdu (CN); Lianping Guo, Chengdu (CN); Xiaoman Jiao, Chengdu (CN); Wuhuang Huang, Chengdu (CN); Hao Zeng, Chengdu (CN); Feng Tan, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 339 days.

(21) Appl. No.: 15/859,987

(22) Filed: Jan. 2, 2018

(65) Prior Publication Data

US 2018/0188291 A1 Jul. 5, 2018

(30) Foreign Application Priority Data

Jan. 3, 2017 (CN) .......................... 2017 1 0001819
Jan. 3, 2017 (CN) .......................... 2017 1 0001820

(51) Int. Cl.
*G01R 13/02* (2006.01)
(52) U.S. Cl.
CPC .............................. *G01R 13/0254* (2013.01)

(58) Field of Classification Search
CPC .................................................. G01R 13/0254
USPC ............................................................ 702/67
See application file for complete search history.

(56) References Cited

U.S. PATENT DOCUMENTS

| 5,103,427 | A | * | 4/1992 | Erdol | ................. | G01S 7/52046 367/11 |
|---|---|---|---|---|---|---|
| 7,191,079 | B2 | | 3/2007 | Smith et al. | | |
| 9,207,263 | B2 | | 12/2015 | Kelly | | |
| 2011/0166813 | A1 | | 7/2011 | Kelly | | |
| 2018/0138896 | A1 | * | 5/2018 | Xie | ........................ | G06F 17/18 |

* cited by examiner

*Primary Examiner* — Eman A Alkafawi
(74) *Attorney, Agent, or Firm* — Oliff PLC

(57) ABSTRACT

The present invention provides a method and system for oscilloscope triggering. The power spectrum entropy threshold $G_p$ and the singular spectrum entropy threshold $G_s$ are obtained by calculating the averages of the power spectrum entropy $H_i$ and the singular spectrum entropy $E_i$ of the first a waveform data frames respectively. Then, for the waveform data frame $x_{a+1}(\tau)$ and thereafter, If the power spectrum entropy $H_i$ is greater than power spectrum entropy threshold $G_p$ and the singular spectrum entropy $E_i$ is greater than the singular spectrum entropy threshold $G_s$, the waveform data frame $x_i(\tau)$ is an abnormal signal, the second trigger occurs, storing and displaying the waveform data frame. Thus the storage and display of abnormal signal is realized.

2 Claims, 2 Drawing Sheets

… … … … … … … … … … … … … … … … … … … … … … … … … … … … … … … … … … … … … … … … … … … … … … … … …

METHOD AND SYSTEM FOR OSCILLOSCOPE TRIGGERING

FIELD OF THE INVENTION

This application claims priority under the Paris Convention to Chinese Patent Application No. 201710001819.3 20171001820.6, Filed on Jan. 3, 2017, the entirety of which is hereby incorporated by reference for all purposes as if fully set forth herein.

The present invention relates to the field of digital storage oscilloscope (DSO), more particularly to a method and system for oscilloscope triggering.

BACKGROUND OF THE INVENTION

Modern electronic signals is becoming increasingly complicated and diversified, and the information carried by the signals is diverse, random and of large amount. How to effectively extract the information, i.e. how to realize real-time acquisition and analysis of wideband, transient and non-stationary signals has brought challenge to modern signal measurement. To meet the challenge, the time-domain measurement based on real-time sampling and processing has attracted attention widely and has become the mainstream of modern signal measurement.

In time-domain measurement, the digital storage oscilloscope (DSO) has been widely used. With the increasing complexity of measured signal, the capture capacity for abnormal signals, such as occasional signal and transient signal, has become an important indicator of evaluating the performance of DSO's data acquisition.

Generally, the capture capacity for abnormal signal can be improved by two methods: one is just improving the waveform capture rate (WRC) of DSO, the WCR can be defined as the number of waveforms that can be captured in a unit time (wfms/s), and the higher the WRC is, the bigger the probability of capturing abnormal signal by DSO is; another is finding the abnormal or occasional signal through long time's waveform capture by infinite persistence. However, in the two methods, long time is needed to capture the abnormal or occasional signal, therefore, both the two methods are inefficient, moreover, when displayed, the waveforms acquired by multi triggers are superimposed, which make the user difficult to identify and study the abnormal or occasional signal, leading to inconvenience for measurement.

The trigger system of DSO can ensure that the each acquisition start at the positions which are satisfied with the triggering condition. thus the acquired waveforms are synchronized. For the periodic signal, the acquired waveforms are overlapped, a stable display can be obtained. Furthermore, the trigger system of DSO can not only ensure the stable display of periodic signal, but also can ensure the capture and display of the signal with specific features. In a word, the trigger has two main functions: one is ensuring waveform's stable display, another is capturing the interested signal. General speaking, the trigger is used to control the storage and display of DSO.

SUMMARY OF THE INVENTION

The present invention aims to overcome the deficiencies of the prior art and provides a method and system for oscilloscope triggering to realize the storage and display of abnormal signal.

To achieve these objectives, in accordance with the present invention, a method for oscilloscope triggering is provided, comprising:

(1) acquiring the waveform data of an input signal x(t) according to a first trigger parameters through an ADC (Analog to Digital Convertor) in a DSO (Digital Storage Oscilloscope), thus a serial of waveform data frames $x_i(\tau)$ are obtained in sequence, where t is time, i is frame serial number, τ is sampling time;

(2) calculating the power spectrum entropy $H_i$ and the singular spectrum entropy $E_i$ of waveform data frame $x_i(\tau)$, where i=1, 2, . . . , a, a is the preset number of waveform data frames, then obtaining a power spectrum entropy threshold $G_p$ and a singular spectrum entropy threshold $G_s$ through the following equations:

$$G_p = \frac{1}{a}\sum_{i=1}^{a} H_i, \quad G_s = \frac{1}{a}\sum_{i=1}^{a} E_i;$$

(3) for the waveform data frame $x_{a+1}(\tau)$ and thereafter, calculating the power spectrum entropy $H_i$ and the singular spectrum entropy $E_i$ of waveform data frame $x_i(\tau)$, where i=a+1, a+2, . . . ; if $H_i > G_p$ and $E_i > G_s$, then the waveform data frame $x_i(\tau)$ is an abnormal signal, the second trigger occurs, a second trigger signal is sent to an abnormal signal storage by a second trigger module, storing the waveform data frame $x_i(\tau)$ by an abnormal signal storage module and displaying the waveform data frame $x_i(\tau)$ by a display module, else the waveform data frame $x_i(\tau)$ is a normal signal, the second trigger does not occur, discarding the waveform data frame $x_i(\tau)$.

In accordance with the present invention, a system for oscilloscope triggering is further provided, comprising a first trigger module, an ADC module (Analog to Digital Convertor), an acquisition storage module, a feature extraction module, a threshold setting module, a second trigger module, an abnormal signal storage module, a display module, wherein:

the first trigger module is used for setting the first trigger parameters, the set first trigger parameters are sent to the ADC module;

the ADC module acquires the waveform data of input signal x(t) according to the first trigger parameters sent by the first trigger module, thus a serial of waveform data frames $x_i(\tau)$ are obtained in sequence and sent to the acquisition store module, where t is time, i is frame serial number, τ is sampling time;

the acquisition storage module receives and stores the waveform data frames $x_i(\tau)$;

the feature extraction module successively read out the waveform data frames $x_i(\tau)$ from the acquisition storage module, then calculates the power spectrum entropy $H_i$ and the singular spectrum entropy $E_i$ of waveform data frame $x_i(\tau)$; and sends the power spectrum entropy $H_1$ to $H_a$ and the singular spectrum entropy $E_1$ to $E_a$ of the waveform data frame $x_1(\tau)$ to $x_a(\tau)$ to the threshold setting module, where a is the preset number of waveform data frames, then sends the power spectrum entropy $H_i$ and the singular spectrum entropy $E_i$ of waveform data frame $x_i(\tau)$ to the second trigger module, where i=a+1, a+2, . . . ;

the threshold setting module receives the power spectrum entropy $H_1$ to $H_a$ and the singular spectrum entropy $E_1$ to $E_a$, and then obtains the power spectrum entropy threshold $G_p$ and the singular spectrum entropy threshold $G_s$ through the following equations:

$$G_p = \frac{1}{a}\sum_{i=1}^{a} H_i, \quad G_s = \frac{1}{a}\sum_{i=1}^{a} E_i;$$

the power spectrum entropy threshold $G_p$ and the singular spectrum entropy threshold $G_s$ obtained by threshold setting module are sent to the second trigger module;

after received the power spectrum entropy threshold $G_p$ and the singular spectrum entropy threshold $G_s$, the second trigger module receives the power spectrum entropy $H_i$ and the singular spectrum entropy $E_i$ of waveform data frame $x_i(\tau)$, where i=a+1, a+2, . . . , ; if $H_i > G_p$ and $E_i > G_s$, then the waveform data frame $x_i(\tau)$ is an abnormal signal, the second trigger occurs, a second trigger signal is sent to the abnormal signal storage module, or the waveform data frame $x_i(\tau)$ is a normal signal, the second trigger does not occur, the waveform data frame $x_i(\tau)$ is discarded;

when received the second trigger signal sent by the second trigger module, the abnormal signal storage module read out the waveform data frame which corresponds to the abnormal signal judged by the second trigger module from the acquisition storage module, and then stores the waveform data frame;

when the display refresh time arrives, the display module read out the waveform data frames which correspond to the abnormal signals from the abnormal signal storage module in turn, and displays them on the screen of a DSO (Digital Storage Oscilloscope).

The objectives of the present invention are realized as follows:

In the present invention, a serial of waveform data frames $x_i(\tau)$ are obtained in sequence by acquiring the waveform data of input signal x(t) according to the first trigger parameters. the power spectrum entropy threshold $G_p$ and the singular spectrum entropy threshold $G_s$ are obtained by calculating the averages of the power spectrum entropy $H_i$ and the singular spectrum entropy $E_i$ of the first a waveform data frames respectively. Then, for the waveform data frame $x_{a+1}(\tau)$ and thereafter, the power spectrum entropy $H_i$ and the singular spectrum entropy $E_i$ of each waveform data frame is calculated; If the power spectrum entropy $H_i$ is greater than power spectrum entropy threshold $G_p$ and the singular spectrum entropy $E_i$ is greater than the singular spectrum entropy threshold $G_s$, the waveform data frame $x_i(\tau)$ is an abnormal signal, the second trigger occurs, a second trigger signal is sent to the abnormal signal storage module, or the waveform data frame $x_i(\tau)$ is a normal signal, the second trigger does not occur, the waveform data frame $x_i(\tau)$ is discarded.

In present invention, the power spectrum entropy and the singular spectrum entropy are taken as the measurement features of the measured signal, and based on which, the recognition and retention of abnormal signal and the discard of normal signal, i.e. the trigger, storage and display of abnormal signal are realized. At the same time, the burden of storing and processing the redundant data is reduced at a certain extent. the simulation and measurement results show that the present invention can implement the trigger of abnormal signals with various complexity, such as noise jamming, AD quantization error, harmonic distortion, amplitude modulation and frequency (or phase) modulation.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Figure 1:
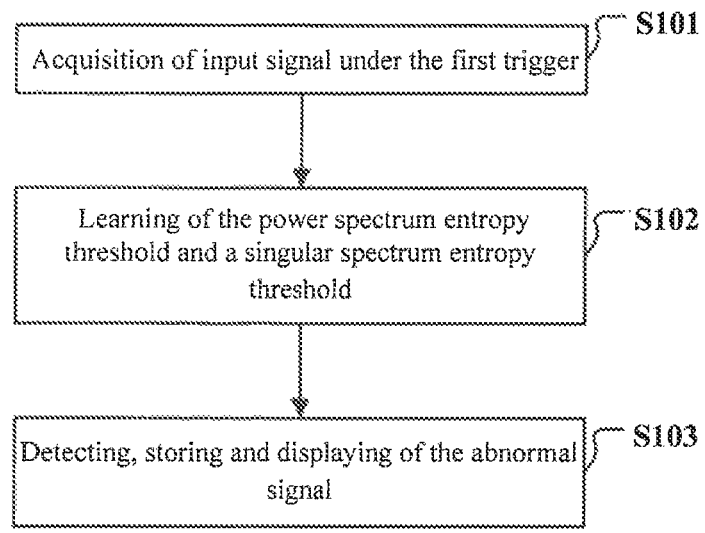
FIG. 1 is a flowchart of a method for oscilloscope triggering according to one embodiment of the present invention.

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

Information entropy expresses the probability of discrete random events in numerical form and measures the degree of uncertainty of information. From the perspective of information entropy, the transient and abnormal components superposed in a signal make the signal's information entropy different from others, which lays a foundation for improving the performance of real-time signal measurement.

According to the information entropy theory of signal complexity, the present invention proposes an abnormal signal triggering method based on time-domain and frequency-domain information entropy, and designs an abnormal signal triggering system based on two-stage trigger in signal acquisition. The power spectrum entropy and the singular spectrum entropy, which represent the complexity of signals, are used as trigger conditions in signal acquisition, and by the control of common trigger, i.e. the first trigger and information trigger, i.e. the second trigger together, thus the feature extraction and anomaly identification of measured signal are realized. Both the results of simulation and measurement show that the method and system could successfully and effectively implement the trigger of abnormal signals with various complexity (e.g. noise interference, ADC quantization error, harmonic distortion, amplitude modulation and frequency modulation), and provides a new way for the realization of abnormal signal detection in DSO.

FIG. 1 is a flowchart of a method for oscilloscope triggering according to one embodiment of the present invention.

In present invention, the power spectrum entropy and the singular spectrum entropy are taken as the measurement features of the measured signal. Based on the measurement features, the second trigger occurs or does not occurs, thus the abnormal signals are stored and displayed. As shown in FIG. 1, the method for oscilloscope triggering is provided, comprising:

Step S101: Acquisition of an Input Signal Under the First Trigger

Acquiring the waveform data of input signal x(t) according to the first trigger parameters, thus a serial of waveform data frames $x_i(\tau)$ are obtained in sequence, where t is time, i is frame serial number, τ is sampling time. The first trigger is conventional trigger, such as edge trigger (rising/falling), video trigger and pulse width (or glitch). This step belongs to prior art, so the details are omitted here.

Step S102: Learning of a Power Spectrum Entropy Threshold and a Singular Spectrum Entropy Threshold In learning stage, the power spectrum entropy $H_i$ and the singular spectrum entropy $E_i$ of waveform data frame $x_i(\tau)$ are calculated respectively, where i=1, 2, . . . , a, a is the preset number of waveform data frames, then a power spectrum entropy threshold $G_p$ and a singular spectrum entropy threshold $G_s$ are obtained through the following equations:

$$G_p = \frac{1}{a}\sum_{i=1}^{a} H_i, G_s = \frac{1}{a}\sum_{i=1}^{a} E_i; \qquad (1)$$

In present invention, the trigger of abnormal signal can be divided into learning stage and detecting stage. The calculation of power spectrum entropy threshold $G_p$ and singular spectrum entropy threshold $G_s$ based on the first a waveform data frames belongs to the learning stage, and the user can set the number of waveform data frames, i.e. a, for the learning. After obtained the power spectrum entropy threshold $G_p$ and the singular spectrum entropy threshold $G_s$, the detecting stage can be started.

Step S103: Detecting, Storing and Displaying of the Abnormal Signal

For the waveform data frame $x_{a+1}(\tau)$ and thereafter, the power spectrum entropy $H_i$ and the singular spectrum entropy $E_i$ of waveform data frame $x_i(\tau)$ is calculated in sequence, where i=a+1, a+2, . . . ; if $H_i > G_p$ and $E_i > G_s$, then the waveform data frame $x_i(\tau)$ is an abnormal signal, i.e. the abnormal signal is detected, so the second trigger occurs, storing and displaying the waveform data frame $x_i(\tau)$, or the waveform data frame $x_i(\tau)$ is a normal signal, the second trigger does not occur, discarding the waveform data frame $x_i(\tau)$.

Based on the description above, the second trigger depends on the calculation of the power spectrum entropy $H_i$ and the singular spectrum entropy $E_i$.

Figure 2:
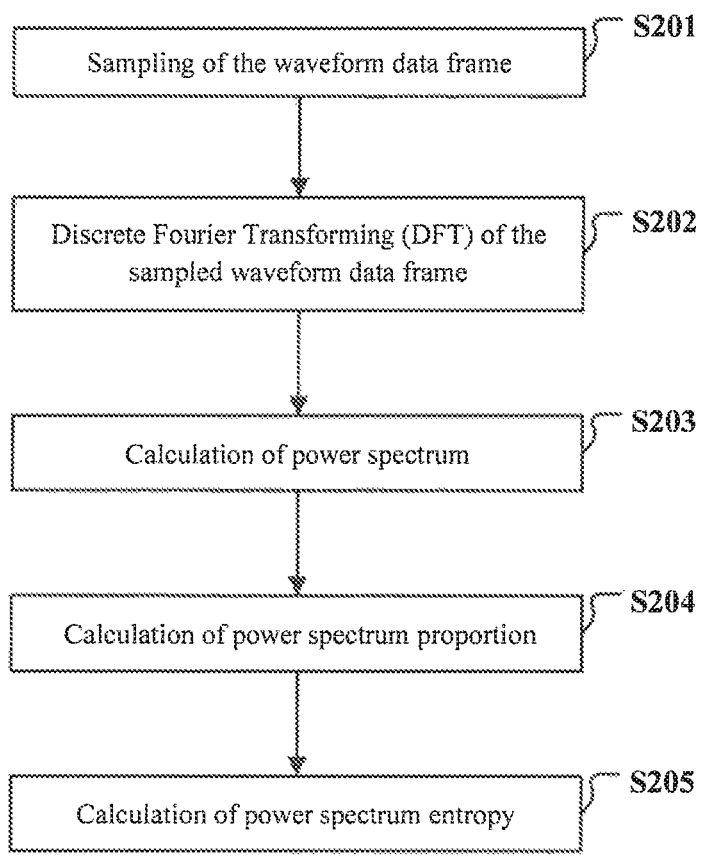
FIG. 2 is a flowchart of the calculation of the power spectrum entropy according to one embodiment of the present invention.

FIG. 2 is a flowchart of the calculation of the power spectrum entropy according to one embodiment of the present invention.

As shown in FIG. 2, the calculation of power spectrum entropy comprises the following steps:

Step S201: Sampling of the Waveform Data Frame

The calculation of the power spectrum entropy increases exponentially with the length of waveform data frame. However, the length of waveform data frame is determined by the memory depth of DSO, and too long for real-time measurement. Therefore, in one embodiment of present invention, the waveform data frame is sampled at a certain interval according to a sampling rate, where the sampling rate depends on the memory depth of DSO. the sampled waveform data frame can be written as $X=\{x_n\}$, where n=0, 1, . . . , N−1, N is the length of the sampled waveform data frame.

Step S202: Discrete Fourier Transforming (DFT) of the Sampled Waveform Data Frame The sampled waveform data frame $X=\{x_n\}$ is transformed by DFT, obtaining:

$$X(k) = \sum_{n=0}^{N-1} x_n e^{-j\frac{2\pi}{N}nk} \qquad (2)$$

Where k is the frequency order, k=0, 1, . . . , N−1, j is imaginary notation.

Step S203: Calculation of Power Spectrum

According to the relation between the energy and the power of signal, the power spectrum S(k) of each frequency order is obtained:

$$S(k) = \frac{1}{N}|X(k)|^2. \qquad (3)$$

Step S204: Calculation of Power Spectrum Proportion

According to parseval theorem, the energy of signal is conserved, when the signal is transformed from the time-domain to frequency-domain. Thus the total energy is 1/N of the sum of the energy $|X(k)|^2$ of each frequency order. Therefore, the power spectrum S={S(0), S(1), . . . , S(N−1)} of each frequency order can be taken as the divide of the original signal, the power spectrum proportion can be defined as:

$$q_k = \frac{S(k)}{\sum_{k'=0}^{N-1} S(k')}; \qquad (4)$$

Where $q_k$ is the proportion of the $k^{th}$ power spectrum component in the whole power spectrum.

Step S205: Calculation of Power Spectrum Entropy

The power spectrum entropy H can be calculated according to the following equation:

$$H = -\sum_{k=0}^{N-1} q_k \log q_k; \qquad (5)$$

According to the analysis above, the power spectrum entropy reflects uncertainty of signal's energy at the proportion. The more simple the signal is, the more focused the power spectrum is, thus the smaller the power spectrum entropy is; Reversely, the more complex the signal is, the more smooth the power spectrum is, thus the greater the power spectrum entropy is. Therefore, the power spectrum entropy can be used for detecting the abnormal signal. However, the power spectrum entropy is insensitive to some types of signal, the singular spectrum entropy is also introduced in present invention as a supplement.

Figure 3:
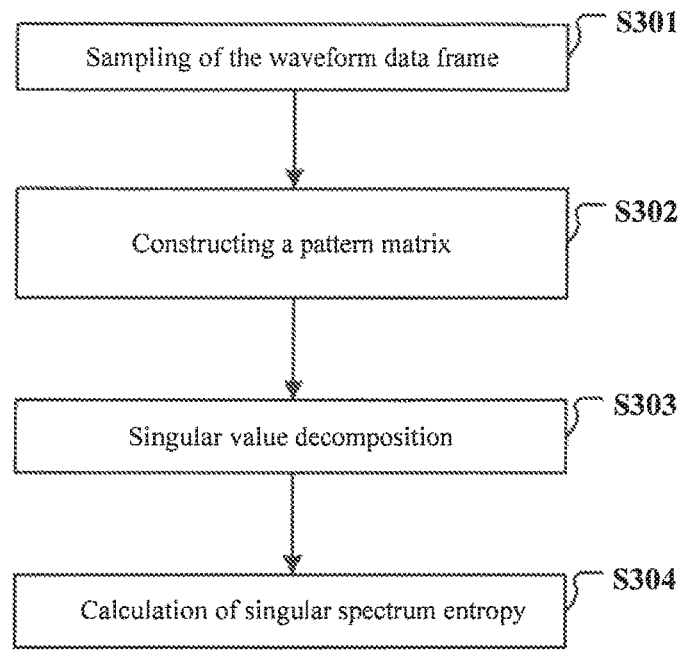
FIG. 3 is a flowchart of the calculation of the singular spectrum entropy according to one embodiment of the present invention.

FIG. 3 is a flowchart of the calculation of the singular spectrum entropy according to one embodiment of the present invention;

As shown in FIG. 3, the calculation of the singular spectrum entropy comprises the following steps:

Step S301: Sampling of the Waveform Data Frame

The calculation of the singular spectrum entropy increases exponentially with the length of waveform data frame. However, the length of waveform data frame is determined by the memory depth of DSO, and too long for real-time measurement. Therefore, in one embodiment of present invention, the waveform data frame is sampled at a certain interval according to a sampling rate, where the sampling rate depends on the memory depth of DSO. the sampled waveform data frame can be written as $X=\{x_n\}$, where n=0, 1, . . . , N−1, N is the length of the sampled waveform data frame.

Step S302: Constructing a Pattern Matrix

The window length is set as M, and the time delay constant is set as δ. To make the best use of signal's information, 1 is selected as the time delay constant. The sampled waveform data frame X={$x_n$} is divided into λ pieces of pattern data using pattern window of (M,δ), thus a pattern matrix A is constructed as follows:

$$A = \begin{bmatrix} x_1 & x_2 & \cdots & x_M \\ x_{\delta+1} & x_{\delta+2} & \cdots & x_{\delta+M} \\ \vdots & \vdots & & \vdots \\ x_{(\lambda-1)\delta+1} & x_{(\lambda-1)\delta+2} & \cdots & x_{(\lambda-1)\delta+M} \end{bmatrix}; \quad (6)$$

$$\lambda = \left\lceil \frac{N = M + 1}{\delta} \right\rceil; \quad (7)$$

Where ⌈ ⌉ is ceiling sign.

Step S303: Singular Value Decomposition

The pattern matrix A obtained in Step S302 is processed by singular value decomposition. For the window length M is less than the length of waveform data frame, M nonzero singular values is obtained, and written as $\delta_1 \geq \delta_2 \geq \ldots > \delta_M$, $\delta_m$ forms the singular spectrum entropy of waveform data frame, where m=0, 1, . . . , M. The number of nonzero singular values reflects the number of the different patterns in columns of pattern matrix A, the value of singular value $\delta_m$ reflects the proportion of the corresponding pattern in all patterns.

Step S304: Calculation of Singular Spectrum Entropy

According to the relation between the singular value and the patterns in the pattern matrix A, the singular value {$\delta_m$} is a divide of waveform data frame in time-domain. Therefore, the singular spectrum entropy in time-domain can be defined as follows:

$$E = -\sum_{m=1}^{M} p_m \log p_m; \quad (8)$$

$$p_m = \frac{\sigma_m}{\sum_{m'=1}^{M} \sigma_{m'}} \quad (9)$$

Where $p_m$ is the proportion of the $m^{th}$ singular value, m=1, 2, . . . , M.

According to the analysis above, the singular spectrum entropy reflects uncertainty of signal's energy at the proportion. The more simple the signal is, the more focused at several pattern the energy is, thus the smaller the singular spectrum entropy is; Reversely, the more complex the signal is, the more decentralized the energy is thus the greater the singular spectrum entropy is. Therefore, the singular spectrum entropy can be used for detecting the abnormal signal.

Figure 4:
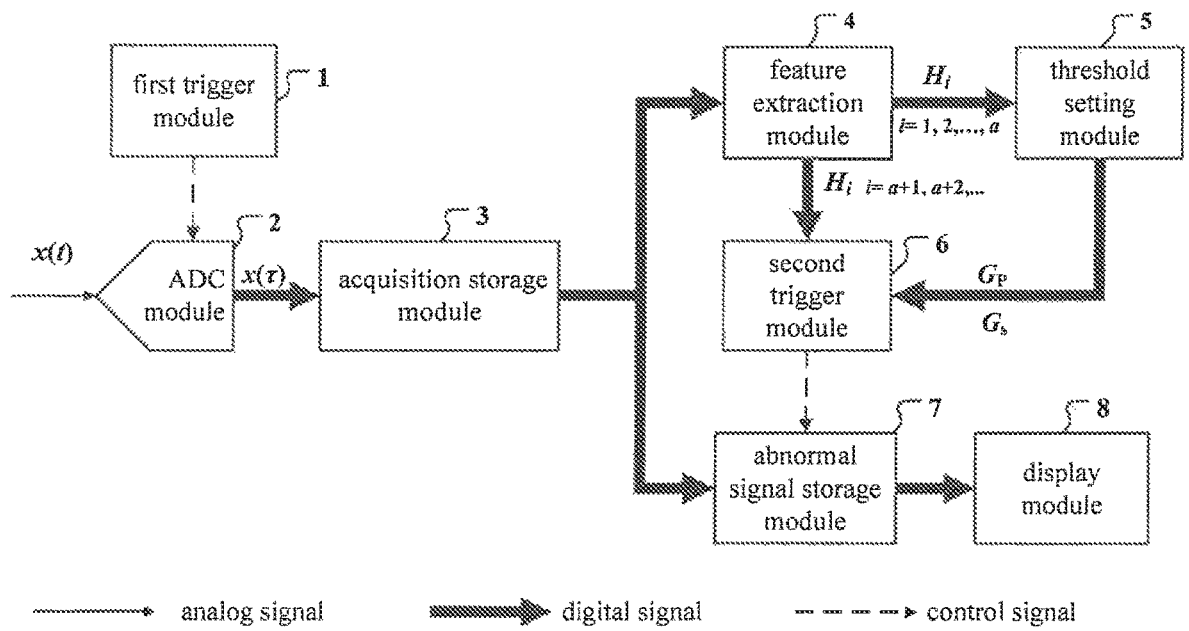
FIG. 4 is a diagram of a system for oscilloscope triggering according to one embodiment of the present invention.

FIG. 4 is a diagram of t a system for oscilloscope triggering according to one embodiment of the present invention.

As shown if FIG. 4, a system for oscilloscope triggering is provided, which comprises a first trigger module 1, an ADC module 2, an acquisition storage module 3, a feature extraction module 4, a threshold setting module 5, a second trigger module 6, an abnormal signal storage module 7, a display module 8. the details of those modules are described as follows.

The first trigger module 1 is used for setting the first trigger parameters, the set first trigger parameters are sent to the ADC module 2. The first trigger is conventional trigger, such as edge trigger (rising/falling), video trigger and pulse width (or glitch).

The ADC module 2 acquires the waveform data of input signal x(t) according to the first trigger parameters sent by the first trigger module 1, thus a serial of waveform data frames $x_i(\tau)$ are obtained in sequence and sent to the acquisition store module 3, where t is time, i is frame serial number, τ is sampling time.

The acquisition storage module 3 receives and stores the waveform data frames $x_i(\tau)$.

The feature extraction module 4 successively read out the waveform data frames $x_i(\tau)$ from the acquisition storage module 3, then calculates the power spectrum entropy $H_i$ and the singular spectrum entropy $E_i$ of waveform data frame $x_i(\tau)$; and sends the power spectrum entropy $H_1$ to $H_a$ and the singular spectrum entropy $E_1$ to $E_a$ of the waveform data frame $x_1(\tau)$ to $x_a(\tau)$ to the threshold setting module 5, where a is the preset number of waveform data frames, then sends the power spectrum entropy $H_i$ and the singular spectrum entropy $E_i$ of waveform data frame $x_i(\tau)$ to the second trigger module 6, where i=a+1, a+2, . . . .

The threshold setting module 5 receives the power spectrum entropy $H_1$ to $H_a$ and the singular spectrum entropy $E_1$ to $E_a$, and then obtains the power spectrum entropy threshold $G_p$ and the singular spectrum entropy threshold $G_s$ through the following equations:

$$G_p = \frac{1}{a}\sum_{i=1}^{a} H_i, \quad G_s = \frac{1}{a}\sum_{i=1}^{a} E_i. \quad (10)$$

The power spectrum entropy threshold $G_p$ and the singular spectrum entropy threshold $G_s$ obtained by threshold setting module 5 are sent to the second trigger module 6.

After received the power spectrum entropy threshold $G_p$ and the singular spectrum entropy threshold $G_s$, the second trigger module 6 receives the power spectrum entropy $H_i$ and the singular spectrum entropy $E_i$ of waveform data frame $x_i(\tau)$, where i=a+1, a+2, . . . , ; if $H_i > G_p$ and $E_i > G_s$, then the waveform data frame $x_i(\tau)$ is an abnormal signal, the second trigger occurs, a second trigger signal is sent to the abnormal signal storage module 7, or the waveform data frame $x_i(\tau)$ is a normal signal, the second trigger does not occur, the waveform data frame $x_i(\tau)$ is discarded.

When received the second trigger signal sent by the second trigger module 6, the abnormal signal storage module 7 read out the waveform data frame which corresponds to the abnormal signal judged by the second trigger module 6 from the acquisition storage module 3, and then stores the waveform data frame;

When the display refresh time arrives, the display module 8 read out the waveform data frames which correspond to the abnormal signals from the abnormal signal storage module 3 in turn, and displays them on the screen of DSO.

Simulation

To verify the validity of present invention, we constructs a DSO with sampling rate $f_s$=100 MSPS, memory depth D=1 kpts (i.e. the waveform data frame's length N=$10^3$), and use a sinusoidal signal as the normal signal, the other six signals with different complexities as abnormal signals.

The sinusoidal signal can be written as $x_1(t)=\sin(2\pi f_0 t)$, where frequency $f_0$=100 MHz. The other six signals are as follows:

1. Amplitude modulation signal $x_2(t)=\sin(2\pi f_1 t)\times\sin(2\pi f_0 t)$, where the carrier frequency $f_0=1$ MHz, the modulating signal's frequency $f_1=100$ kHz, the modulation depth is 1;

2. Frequency modulation signal $x_3(t)=\sin[2\pi f_0 t+0.5kt^2)]$, where the carrier frequency $f_0=1$ MHz, the modulation bandwidth B=1.1 MHZ, the modulation slope k=11;

3. Sinusoidal signal+harmonic signal $x_4(t)=[\sin(2\pi f_0 t)+\sin(6\pi f_0 t)+\sin(10\pi f_0 t)+\sin(14\pi f_0 t)]/4$, where frequency $f_0=100$ MHz;

4. Sinusoidal signal+burr signal, where sinusoidal signal $x_5(t)=\sin(2\pi f_0 t)$, frequency $f_0=100$ MHz, the burr signal can be transient signal, such as occasional noise inference and AD quantization error;

5. Sinusoidal signal+WGN signal $x_6(t)=\sin(2\pi f_0 t)+N$, i.e. a white Gaussian noise (WGN) N are superimposed in sinusoidal signal $\sin(2\pi f_0 t)$, the mean value of WGN is 0, the variance of WGN is 0.1;

6. WGN signal $x_7(t)=\sin(2\pi f_0 t)+N$, the mean value of WGN is 0, the variance of WGN is 0.1.

The power spectrum entropy H and the singular spectrum entropy E of the normal signal and the other six signals are listed in Table 1:

TABLE 1

| $x_i(t)$ | Sinusoidal signal $x_1(t)$ | Amplitude modulation signal $x_2(t)$ | Frequency modulation signal $x_3(t)$ | Sinusoidal signal + harmonic signal $x_4(t)$ | Sinusoidal signal + burr signal $x_5(t)$ | Sinusoidal signal + WGN signal $x_6(t)$ | WGN signal $x_7(t)$ |
|---|---|---|---|---|---|---|---|
| E | 0.6931 | 1.3863 | 0.9356 | 2.0794 | 3.4264 | 4.8643 | 6.0521 |
| H | 0.6931 | 1.3863 | 1.6093 | 2.0794 | 0.7156 | 0.9019 | 6.4618 |

From the Table 1, we will find that, with the complexity variation of input signal, the power spectrum entropy H and the singular spectrum entropy E vary accordingly. However, the sensitivities of the power spectrum entropy and the singular spectrum entropy are different, therefore, the power spectrum entropy and the singular spectrum entropy are combined to judge whether the waveform data frame is an abnormal signal or a normal signal.

While illustrative embodiments of the invention have been described above, it is, of course, understand that various modifications will be apparent to those of ordinary skill in the art. Such modifications are within the spirit and scope of the invention, which is limited and defined only by the appended claims.

What is claimed is:

1. A method for oscilloscope triggering, the method comprising:
   acquiring waveform data of an input signal x(t) according to a plurality of first trigger parameters through an ADC (Analog to Digital Convertor) in a DSO (Digital Storage Oscilloscope), which provide a serial of waveform data frames $x_i(\tau)$ in sequence, where t is time, i is frame serial number, $\tau$ is sampling time;
   calculating, by the DSO, a power spectrum entropy $H_i$ and a singular spectrum entropy $E_i$ of each waveform data frame $x_i(\tau)$ of the serial of waveform data frames $x_i(\tau)$, where i=1, 2, ..., a, a is a preset number of waveform data frames $x_i(\tau)$;
   obtaining, by the DSO, a power spectrum entropy threshold $G_p$ and a singular spectrum entropy threshold $G_s$ through the following equations:

$$G_p = \frac{1}{a}\sum_{i=1}^{a} H_i, \quad G_s = \frac{1}{a}\sum_{i=1}^{a} E_i;$$

for each waveform data frame $x_{a+1}(\tau)$, calculating, by the DSO, the power spectrum entropy $H_i$ and the singular spectrum entropy $E_i$ of each waveform data frame $x_i(\tau)$, where i=a+1, a+2, ...;
   when $H_i>G_p$ and $E_i>G_s$ is satisfied:
     determining, by the DSO, that the waveform data frame $x_i(\tau)$ is an abnormal signal,
     transmitting, by a second trigger module of the DSO, a second trigger signal to an abnormal signal memory,
     storing, by an abnormal signal storage module of the DSO, the waveform data frame $x_i(\tau)$, and
     displaying, by a display module of the DSO, the stored waveform data frame $x_i(\tau)$; and
   when $H_i>G_p$ and $E_i>G_s$ is not satisfied,
     determining, by the DSO, that the waveform data frame $x_i(\tau)$ is a normal signal,
     determining, by the DSO, that the second trigger does not occur, and
     discarding, by the DSO, the waveform data frame $x_i(\tau)$.

2. A system for oscilloscope triggering comprising a Digital Storage Oscilloscope (DSO) including:
   a first trigger module setting a plurality of first trigger parameters;
   an Analog to Digital Convertor (ADC) acquiring waveform data of an input signal x(t) according to the plurality of set first trigger parameters transmitted by the first trigger module, which provides a serial plurality of waveform data frames $x_i(\tau)$ that are obtained in sequence, where t is time, i is frame serial number, $\tau$ is sampling time;
   an acquisition storage configured to receive and store the plurality of waveform data frames $x_i(\tau)$;
   a feature extraction module successively analyzing the plurality of stored waveform data frames $x_i(Z)$ received from the acquisition storage, the feature extraction module being configured to calculate a power spectrum entropy $H_i$ and a singular spectrum entropy $E_i$ of the plurality of waveform data frames $x_i(\tau)$, (ii) transmit the respective power spectrum entropy $H_1$ to $H_a$ and the singular spectrum entropy $E_1$ to $E_a$ respectively corresponding to each of the plurality of waveform data frames $x_1(\tau)$ to $x_a(\tau)$ to a threshold setting module, where a is a preset number of the plurality of waveform data frames $x_i(\tau)$, and (iii) transmit the power spectrum entropy $H_i$ and the singular spectrum entropy $E_i$ of the plurality of waveform data frames $x_i(\tau)$ to a second trigger module, where i=a+1, a+2, ...; and
   a display module, wherein:
     the threshold setting module receives the power spectrum entropy $H_1$ to $H_a$ and the singular spectrum entropy $E_1$ to $E_a$, the threshold setting module being configured to acquire and transmit, to the second trigger module, a power spectrum entropy threshold $G_p$ and a singular spectrum entropy threshold $G_s$ through the following equations:

$$G_p = \frac{1}{a}\sum_{i=1}^{a} H_i, \; G_s = \frac{1}{a}\sum_{i=1}^{a} E_i;$$

in response to receiving the power spectrum entropy threshold $G_p$ and the singular spectrum entropy threshold $G_s$, the second trigger module receives the power spectrum entropy $H_i$ and the singular spectrum entropy $E_i$ of the plurality of waveform data frames $x_i(\tau)$, where i=a+1, a+2, . . . , ;

when $H_i > G_p$ and $E_i > G_s$ is satisfied, which determines that the waveform data frame $x_i(\tau)$ is an abnormal signal, the second trigger module transmits a second trigger signal to the abnormal signal storage;

when $H_i > G_p$ and $E_i > G_s$ is not satisfied, which determines that the waveform data frame $x_i(\tau)$ is a normal signal, the second trigger module does not transmit the second trigger signal and discards the waveform data frame $x_i(\tau)$;

in response to receiving the second trigger signal transmitted by the second trigger module, the abnormal signal storage analyzes the waveform data frame $x_i(\tau)$, which corresponds to the abnormal signal judged by the second trigger module from the acquisition storage, and the abnormal signal storage stores the waveform data frame $x_i(\tau)$; and when a display refresh time arrives, the display module displays, on a display screen of the DSO, the waveform data frames $x_i(\tau)$, which correspond to the abnormal signals from the abnormal signal storage sequentially.

\* \* \* \* \*